(12) United States Patent
Hoge et al.

(10) Patent No.: US 10,495,717 B2
(45) Date of Patent: Dec. 3, 2019

(54) SYSTEM AND METHOD FOR DUAL-KERNEL IMAGE RECONSTRUCTION

(71) Applicant: THE GENERAL HOSPITAL CORPORATION, Boston, MA (US)

(72) Inventors: William S. Hoge, Watertown, MA (US); Jonathan R. Polimeni, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 108 days.

(21) Appl. No.: 15/505,389

(22) PCT Filed: Aug. 19, 2015

(86) PCT No.: PCT/US2015/045901
§ 371 (c)(1),
(2) Date: Feb. 21, 2017

(87) PCT Pub. No.: WO2016/032823
PCT Pub. Date: Mar. 3, 2016

(65) Prior Publication Data
US 2017/0276755 A1 Sep. 28, 2017

Related U.S. Application Data

(60) Provisional application No. 62/041,337, filed on Aug. 25, 2014.

(51) Int. Cl.
*G01R 33/565* (2006.01)
*G01R 33/561* (2006.01)
(Continued)

(52) U.S. Cl.
CPC .... *G01R 33/56554* (2013.01); *G01R 33/5611* (2013.01); *G01R 33/5616* (2013.01); *G01R 33/58* (2013.01); *G01V 3/14* (2013.01)

(58) Field of Classification Search
USPC .......................... 324/300–322; 600/407–435
See application file for complete search history.

(56) References Cited

U.S. PATENT DOCUMENTS

| 2006/0066308 A1 | 3/2006 | Hinks et al. |
| 2014/0037171 A1 | 2/2014 | Bhat et al. |

(Continued)

FOREIGN PATENT DOCUMENTS

WO 2015/031560 3/2015

OTHER PUBLICATIONS

The International Search Report and Written Opinion dated Nov. 24, 2015 for International Application No. PCT/US2015/045901.
(Continued)

*Primary Examiner* — Melissa J Koval
*Assistant Examiner* — Tiffany A Fetzner
(74) *Attorney, Agent, or Firm* — Quarles & Brady LLP

(57) ABSTRACT

A method and imaging system is provided that can control a magnetic gradient system and an RF system of an MRI system according to a calibration pulse sequence to acquire positive readout gradient (RO+) data and negative readout gradient (RO−) data. The RO+ data and the RQ− data are assembled to form complete image data sets for the RO+ data and the RQ™ data and the RO+ data and the RO− data are combined to generate the calibration data that is ghost-corrected, substantially free of ghost artifacts, or having reduced ghost artifacts compared to traditionally-acquired calibration data. Reconstruction coefficients are derived from the calibration data. The magnetic gradient system and the RF system are controlled according to an imaging pulse sequence to acquire image data and the image data is reconstructed into an image of the subject using the reconstruction coefficients.

19 Claims, 8 Drawing Sheets

(51) Int. Cl.
*G01R 33/14* (2006.01)
*G01R 33/58* (2006.01)
*G01V 3/14* (2006.01)

(56) References Cited

U.S. PATENT DOCUMENTS

2014/0300357 A1* 10/2014 Bachschmidt ... G01R 33/56536
 324/309
2017/0248668 A1* 8/2017 Shen ................... G01R 33/483

OTHER PUBLICATIONS

Hoge, W. et al. "Robust EPI Nyquist Ghost Elimination via Spatial and Temporal Encoding (EPI-GESTE)"; NIH Public Access; Publication [online], Dec. 1, 2010 [retrieved Oct. 16, 2015]. Retrieved from the Internet <URL: http://www.ncbi.nlm.nih.gov/pmc/articles/PMC3038256/>; pp. 1-19.

* cited by examiner

SYSTEM AND METHOD FOR DUAL-KERNEL IMAGE RECONSTRUCTION

CROSS-REFERENCE TO RELATED APPLICATIONS

This application represents the U.S. National Stage of International Application No. PCT/US2015/045901, filed Aug. 19, 2015 which is based on, claims priority to, and incorporates herein by reference in its entirety, U.S. Provisional Patent Application No. 62/041,337, filed. Aug. 25, 2014, and entitled "SYSTEM AND METHOD FOR DUAL-KERNEL IMAGE RECONSTRUCTION."

STATEMENT REGARDING FEDERALLY SPONSORED RESEARCH

This invention was made with government support under K01EB011498 awarded by the National Institutes of Health. The government has certain rights in the invention.

BACKGROUND

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known image reconstruction techniques.

Depending on the technique used, many NMR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel imaging." Parallel imaging techniques use spatial information from arrays of RF receiver coils to compliment the encoding which would otherwise have to be obtained in a sequential fashion using RF pulses and field gradients (such as phase and frequency encoding). Each of the spatially independent receiver coils of the array carries certain spatial information in the form of a sensitivity profile. This information is utilized in order to achieve a complete location encoding by combining the simultaneously acquired coil data from the separate receiver coils. Specifically, parallel imaging techniques can reconstruct undersampled k-space whereby the number of phase-encoded lines acquired is reduced by increasing the distance between these lines while keeping the maximal extent covered in k-space fixed. The combination of the separate NMR signals produced by the separate receiver coils enables a reduction of the acquisition time required for an image (in comparison to conventional k-space data acquisition) by a factor which in the most favorable case equals the number of the receiver coils. Thus, the use of multiple receiver coils acts to increase imaging speed by accelerating the encoding, without increasing gradient switching rates or RF power.

Two categories of such parallel imaging techniques which have gained wide use with in vivo imaging are exemplified by the SENSitivity Encoding (SENSE) and generalized autocalibrating partially parallel acquisitions (GRAPPA) methods. With SENSE, the undersampled k-space data is first Fourier transformed into the image domain to produce an aliased image from each coil channel, and then the aliased images are, in one step, unaliased and combined by a linear transformation of the superimposed pixel values. This direct unaliasing performed by SENSE requires an explicit estimate of the receiver coil sensitivities.

In contrast, GRAPPA performs a reconstruction of the omitted k-space lines prior to Fourier transformation and coil combination, by constructing a weighted combination of neighboring lines acquired by the different receiver coils. In this way, the receiver coil sensitivities are only implicit in the image reconstruction process, and are not explicitly estimated.

GRAPPA belongs to a class of "auto-calibrated" techniques. With GRAPPA, calibration data in the form of k-space lines typically near the center of k-space are sampled at the Nyquist frequency. These Nyquist-sampled k-space lines are referred to as autocalibration signal (ACS) lines, which are used to determine weighting factors that are utilized to synthesize, or reconstruct, the missing k-space lines. In particular, a linear combination of individual coil data is used to create the missing lines of k-space. The coefficients for the combination are determined by fitting a subset of the calibration data ("source data") to neighboring lines of the calibration data ("target data") across all coil channels in order to learn the relationship between nearby lines of k-space data. These coefficients are later applied to estimating skipped k-space lines from neighboring acquired k-space lines in the accelerated reconstruction.

In dynamic MRI applications, such as functional imaging, interventional imaging, and cardiac imaging, there has long been a need in the art for systems and methods that provide higher spatial and temporal resolution and higher image quality. Accelerated parallel imaging methods are one mechanism to provide this.

One common rapid imaging method that benefits from accelerated parallel imaging is Echo Planar Imaging (EPI), which is a rapid acquisition technique that is broadly used in dynamic MRI applications, including functional, perfusion, and diffusion imaging in neuroimaging, body imaging, and cardiac imaging applications. In EPI, multiple lines of k-space are acquired after a single excitation and therefore it has the ability to freeze motion and to dynamically image the region of interest. However, EPI suffers however from multiple imaging artifacts, which limit its utility and its range of applications. These artifacts include: Nyquist ghosts, which arise from data mismatch that occurs from the rapid sampling of k-space; and geometric distortions, which arise from varying spin-phase evolutions in regions of magnetic field inhomogeneity, disrupting the Fourier encoding of the spin's location. Similar challenges with respect to Nyquist ghosts exist when using other pulse sequences, including turbo spin echo (TSE) and extensions of EPI, like 3D gradient and spin echo (GRASE) sequences. Parallel imaging has been previously combined with EPI and other pulse sequences, which favorably reduces the length of the readout to reduce geometric distortions. To date, many methods have been proposed to correct for Nyquist ghosts, but it remains challenging to completely eliminate their appearance in all applications.

SUMMARY

The present disclosure overcomes the aforementioned drawbacks in ghost correction by providing a parallel imaging formulation that can be used to perform the ghost correction and image reconstruction steps together. To this end, the present disclosure provides systems and methods that can advantageously provide ghost correction within and consistent across both the calibration and accelerated acquisition data. The disclosure can leverage the ability to group and separate subsets of the sampled MRI data and to perform steps of the parallel imaging reconstruction on these subsets individually. In the case of EPI, the readout lines acquired with a positive polarity comprise one subset and the readout lines acquired with a negative polarity comprise a second subset. Once calibrated, this dual-polarity parallel-imaging reconstruction kernel can draw simultaneously from the multiple, yet separate, data sets to synthesize the target image data. In this way, in the case of EPI, the ghost artifact correction process and the parallel imaging reconstruction may be combined as a common operation. Similar multi-kernel approaches can be extended to other imaging methods, such as multi-shot acquisitions, like segmented EPI, turbo spin echo, and the like.

In accordance with one aspect of the disclosure, a magnetic resonance imaging (MRI) system is disclosed that includes a magnet system configured to generate a polarizing magnetic field about at least a portion of a subject arranged in the MRI system, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The system also includes a computer system programmed to control the magnetic gradient system and the RF system according to a calibration pulse sequence to acquire positive readout gradient (RO+) data and negative readout gradient (RO−) data. The computer system is also configured to assemble the RO+ data and the RO− data to form complete image data comprised of the RO+ data and comprised of the RO− data, and combine the RO+ data and the RO− data to generate calibration data having reduced ghost artifacts compared to traditionally-acquired calibration data. The computer system is further configured to derive reconstruction coefficients from the calibration data having reduced ghost artifacts compared to traditionally-acquired calibration data, control the magnetic gradient system and the RF system according to an imaging pulse sequence to acquire image data, and reconstruct the image data into an image of the subject using the reconstruction coefficients.

In accordance with another aspect of the disclosure, a magnetic resonance imaging (MRI) system is disclosed that includes a magnet system configured to generate a polarizing magnetic field about at least a portion of a subject arranged in the MRI system, a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system also includes a computer system programmed to control the magnetic gradient system and the RF system to perform a single- or multi-shot pulse sequence to acquire calibration data and process calibration data based on a polarity of a readout gradient applied with respect to RO+ data and RO− data. The computer system is further programmed to perform a ghost elimination via spatial and temporal encoding (GESTE) process using the RO+ data and a RO− data to generate ghost-corrected calibration data and process calibration data based on a polarity of a readout gradient applied and a segment acquired to form a per-segment RO+ data and a per-segment RO− data. The computer system is also programmed to, using the ghost-corrected calibration data and the per-segment RO+ data and a per-segment RO− data, perform a per-shot GESTE process to generate a per-shot data set and, using the per-shot data set, generate final calibration parameters.

In accordance with yet another aspect of the disclosure, a method is provided for generating calibration data for reconstructing magnetic resonance imaging (MRI) images of a subject acquired using a parallel imaging acquisition process. The method includes performing a multi-shot acquisition of calibration data, processing calibration data based on a polarity of a readout gradient applied with respect to RO+ data and a RO− data, and performing a ghost elimination via spatial and temporal encoding (GESTE) process using the RO+ data and a RO− data to generate ghost-corrected calibration data. The method also includes processing calibration data based on a polarity of a readout gradient applied and a segment acquired to form a per-segment RO+ data and a per-segment RO− data, performing a per-shot GESTE process to generate a per-shot data set using the ghost-corrected calibration data and the per-segment RO+ data and a per-segment RO− data, and generating final calibration parameters using the per-shot data set.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
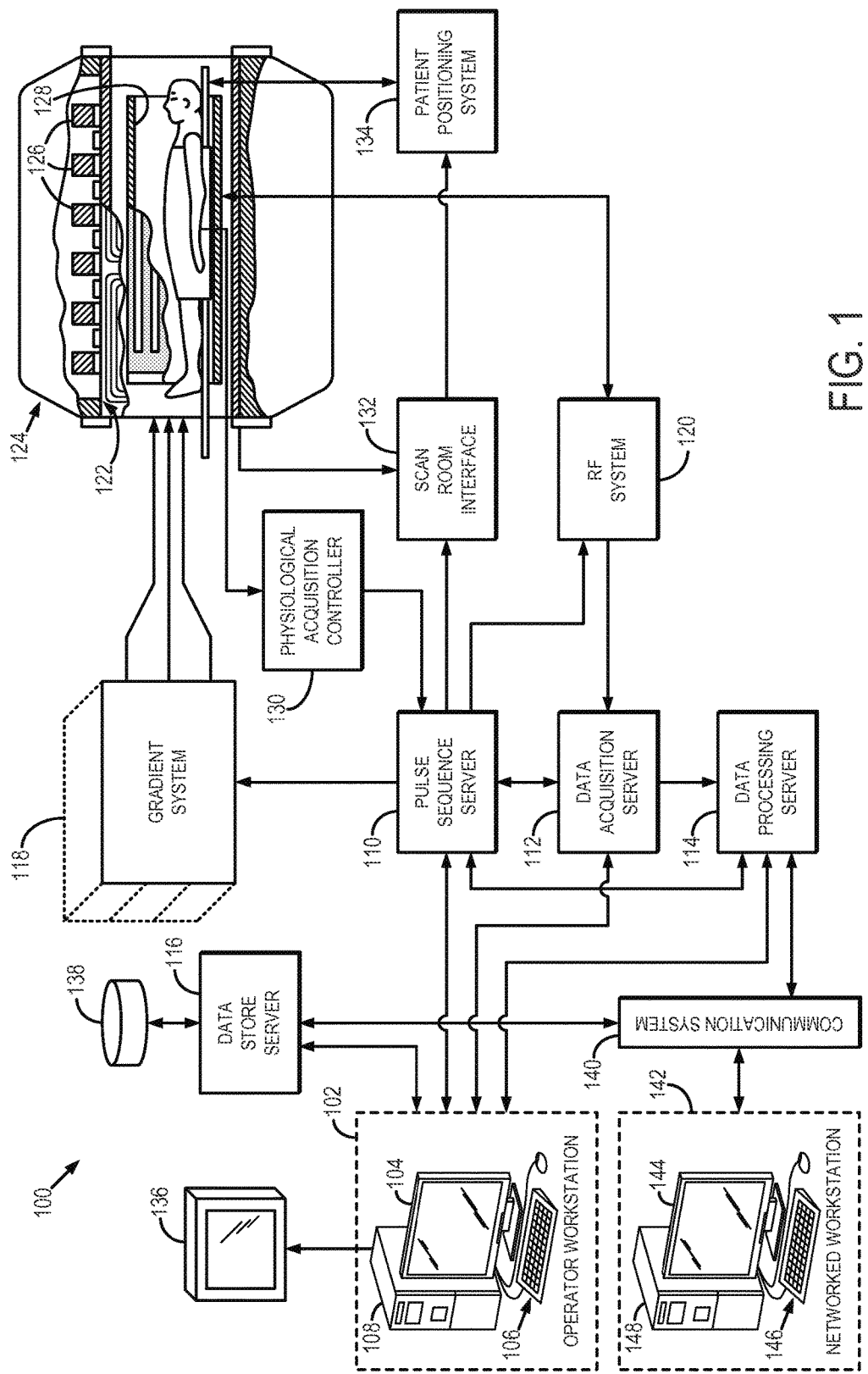
FIG. 1 is a block diagram of an example of a magnetic resonance imaging (MRI) system configured to employ the present invention.

Referring particularly to FIG. 1, an example of a magnetic resonance imaging (MRI) system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or a head (and neck) RF coil for brain imaging).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M = \sqrt{I^2 + Q^2} \quad (1);$$

and the phase of the received MR signal may also be determined:

$$\varphi = \tan^{-1}\left(\frac{Q}{I}\right). \quad (2)$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communications system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
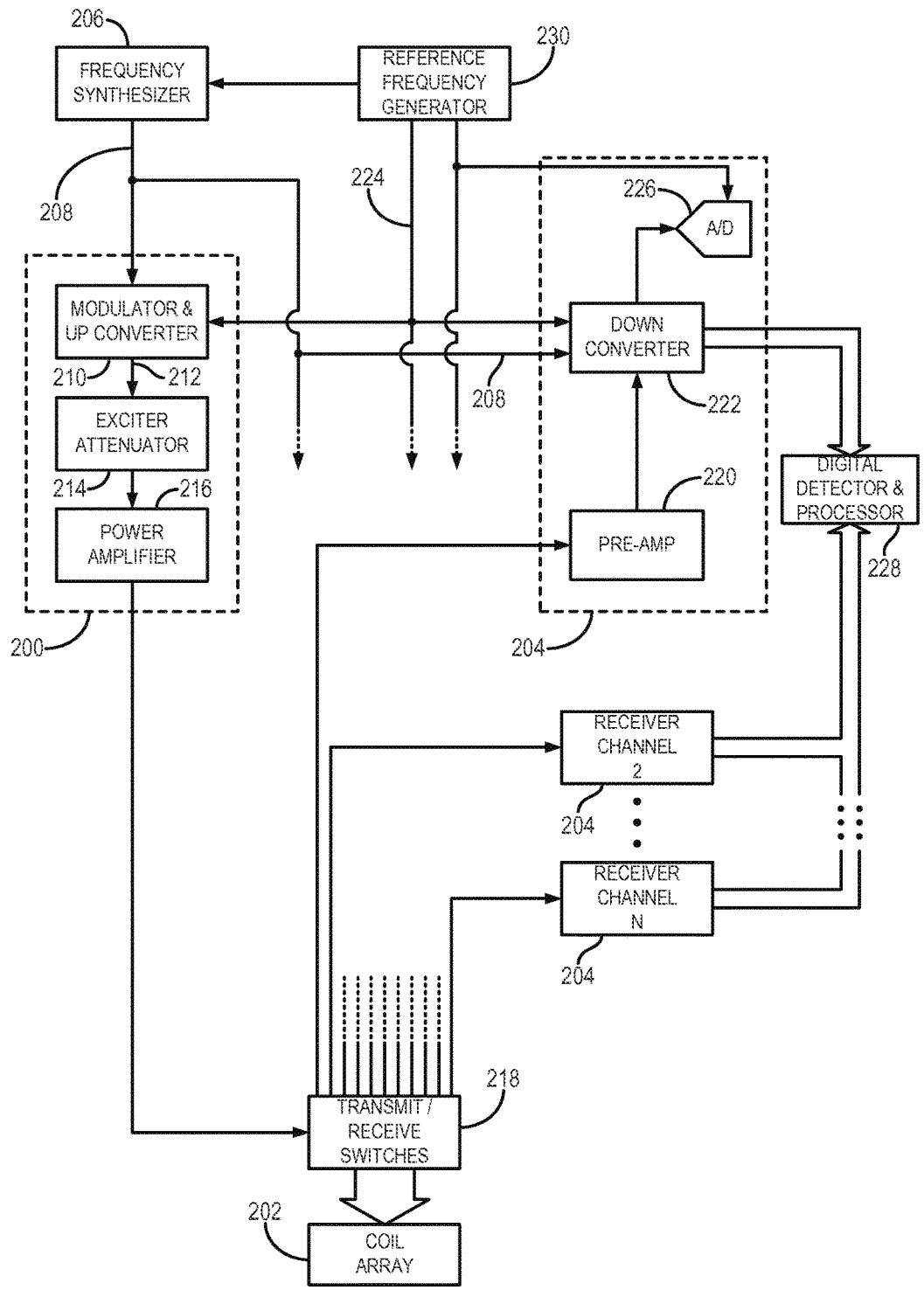
FIG. 2 is a block diagram of a radio frequency (RF) system of an MRI system, such as may be included in the system of FIG. 1.

As shown in FIG. 1, the RF system 120 may be connected to the whole-body RF coil 128, or as shown in FIG. 2, a transmitter section of the RF system may connect to at least one transmit channel 200 of a coil array 202, and its receiver section may connect to at least one receiver channel 204 of the coil array 202. Often, the transmitter section is connected to the whole-body RF coil or a local transmit coil, and, in so-called "parallel receiver" coil arrays, each receiver section is connected to a separate receiver channel 204.

Referring particularly to FIG. 2, the RF system 126 includes a transmitter that produces a prescribed RF excitation field. The base, or carrier, frequency of this RF excitation field is produced under control of a frequency synthesizer 206 that receives a set of digital signals from the pulse sequence server 118. These digital signals indicate the frequency and phase of the RF carrier signal produced at an output 208. The RF carrier is applied to a modulator and up-converter 210 where its amplitude is modulated in response to a signal, R(t), also received from the pulse sequence server 118. The signal. R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 118. The attenuated RF excitation pulses are applied to a power amplifier 216, which drives the RF coil array 202 through a transmit/receive (T/R) switch 218.

Referring still to FIG. 2, the signal produced by the subject is picked up by the coil array 202 and applied to the inputs of a set of receiver channels 204. A pre-amplifier 220 in each receiver channel 204 amplifies the signal by an amount determined by a digital attenuation signal received from the pulse sequence server 118. The received signal is at or around the Larmor frequency, and this high-frequency signal is down-converted in a two step process by a down converter 222, which first mixes the detected signal with the carrier signal on line 208 and then mixes the resulting difference signal with a reference signal on line 224. The down-converted MR signal is applied to the input of an analog-to-digital (A/D) converter 226 that samples and digitizes the analog signal and applies it to a digital detector and signal processor 228 that produces 16-bit in-phase (I) values and 16-bit quadrature (Q) values corresponding to the received signal. The resulting stream of digitized I and Q values of the received signal are output to the data acquisition server 120. The reference signal, as well as the sampling signal applied to the A/D converter 226, are produced by a reference frequency generator 230.

The echo planar imaging (EPI) pulse sequence is a common MR imaging pulse sequence that can be employed with the above-described systems. For example, EPI is widely used to image functional activity in the brain, as it can acquire wholebrain images in repetition times that are well matched to physiological activity. However, EPI commonly suffers from inherent acquisition artifacts including Nyquist ghosting and geometric distortion.

Figure 3:
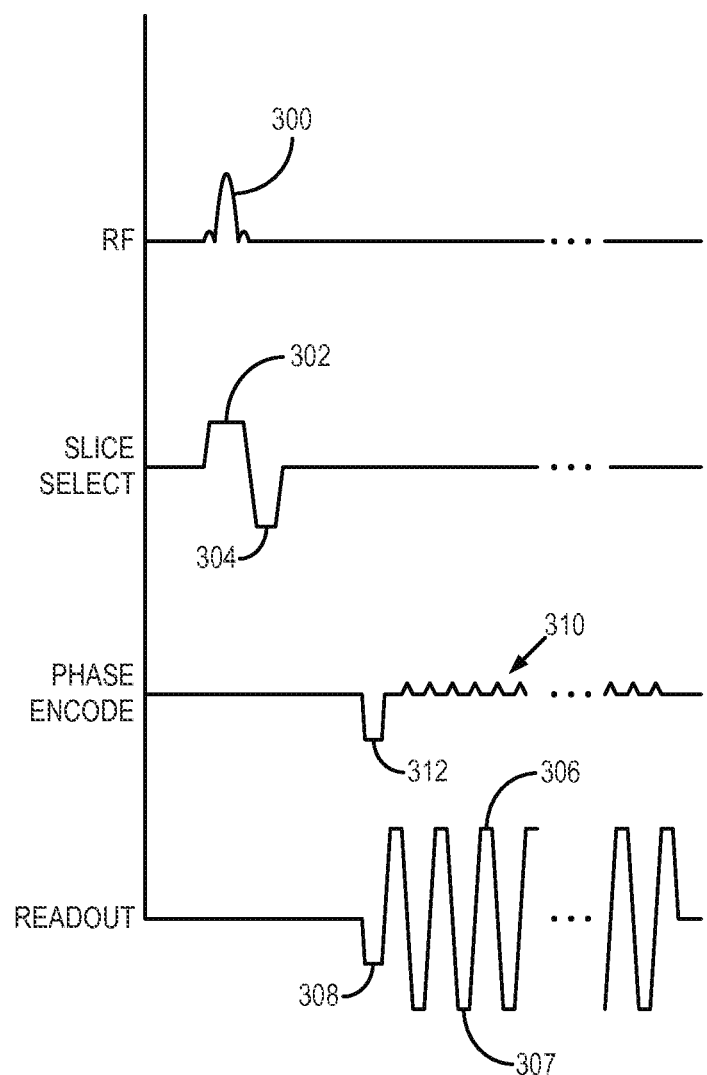
FIG. 3 is a graphic illustration of an exemplary echo planar imaging (EPI) pulse sequence for directing the MRI system of FIG. 1

An exemplary of gradient-recalled echo planar imaging (GE-EPI) pulse sequence is illustrated in FIG. 3. The pulse sequence includes a spatially selective RF excitation pulse 300 that is played out in the presence of a slice-selective gradient 302 in order to produce transverse magnetization in a plurality of prescribed imaging slices. The RF excitation pulse is the summation of RF excitation pulses that would be used to separately excite the desired plurality of slice locations and is applied with a flip angle. The slice-selective gradient 302 includes a rephasing lobe 304 that acts to rephase unwanted phase dispersions introduced by the slice-selective gradient 302 such that signal losses resultant from these phase dispersions are mitigated.

Following excitation of the nuclear spins in the prescribed imaging slices, image data is acquired by sampling a series of gradient-recalled echo signals in the presence of an alternating readout gradient 306/307. As will be described, data acquired during positive readout gradient 306 is referred to as RO+ lines and data acquired during negative readout gradient is referred to as RO−. The alternating readout gradient may be preceded by the application of a pre-winding gradient 308 that acts to move the first sampling point along the frequency-encoding, or readout, direction by a distance $k_{x,max}$ in k-space. Spatial encoding of the echo signals along a phase-encoding direction may be performed by a series of phase encoding gradient "blips" 310, which are each played out in between the successive signals readouts such that each echo signal is separately phase encoded. The phase encoding gradient blips 310 are preceded by the application of a pre-winding gradient 312 that acts to move the first sampling point along the phase-encoding direction a distance $k_{y,max}$ in k-space. Together, the pre-winding gradients 308 and 312 serve to begin the sampling of k-space at a defined k-space location ($k_x$, $k_y$).

As is known in the art, the foregoing pulse sequence may be repeated a plurality of times with a different slice-selective gradient 302 being applied in each repetition such that multiple sets of a plurality of slice locations are sampled. In, for example, a functional MRI (fMRI) study, each repetition is typically coupled with the coordination of functional tasks or stimulus designed to elicit the aforementioned hemodynamic responses that give rise to the BOLD contrast mechanism.

EPI techniques inherently suffer from several drawbacks. For example, the required fast gradient switching for quick traversal through k-space are often mismatched, producing inconsistency in between data acquired on positive versus negative readout gradients. That is, EPI data will be sampled when the readout gradient polarity is both positive and negative. Gradient hardware imperfections and induced eddy currents often induce a shift in the sampling grid between data sampled on opposite polarity gradients. This data shift in the sampling-grid manifests as Nyquist (or N/2) ghosts in the image domain. That is, this mismatch produces Nyquist ghosting, where a faint copy of the imaged object appears shifted by one half of the field-of-view along the phase encoding direction.

Some have tried to create ghost correction algorithms that model the difference between the positive readout gradient (RO+, typically the odd lines) and negative readout gradient (RO−, typically the even lines) k-space lines as a scalar and perform first-order phase correction in hybrid space after Fourier transformation along the readout direction only (in x-$k_y$ coordinates). However, eddy current and magnetic susceptibility effects introduce higher order effects. An algorithm that can estimate or compensate for these higher-order effects will provide better overall ghost correction.

Geometric distortions in EPI are caused by local distortions in the magnetic field. These distortions can be reduced by shortening the EPI echo train length, and parallel imaging (pMRI) methods can be employed for this purpose. pMRI methods are model-based, however, meaning that they are driven by model assumptions related to the acquisition process. When the underlying model differs significantly from the imaging system at hand, pMRI reconstructions can suffer a loss in image quality.

In the course of reconstructing highly-accelerated EPI data using pMRI methods, two important aspects should be maintained between the calibration data and the acquired accelerated data. First, it is important to ensure that the geometric distortions are consistent between the calibration and acquisition data. This can be done, for example, by maintaining equivalent echo spacing between the two data sets. A multi-shot pre-scan may be used for this purpose. Second, it is desirable to employ ghost-free data or data that includes as minimal ghosting as can be achieved for the calibration stage.

An approach to control Nyquist ghosts involves temporal domain encoding (phase labeling for additional coordinate encoding, or PLACE) and spatial domain encoding (phased array ghost elimination, or PAGE). Temporal encoding modulates the echo planar imaging acquisition trajectory from frame to frame, enabling one to interleave data to remove inconsistencies that occur between sampling on positive and negative gradient readouts. With PLACE, one can coherently combine the interleaved data to cancel residual Nyquist ghosts. If the level of ghosting varies significantly from image to image, however, the signal cancellation that occurs with PLACE can adversely affect SNR. Integrating PLACE into a PAGE-based reconstruction process can yield significantly better Nyquist ghost correction that is more robust than PLACE or PAGE alone.

Parallel MR imaging has previously employed an EPI ghost reduction or correction method referred to as EPI Ghost Elimination via Spatial and Temporal Encoding (EPI-GESTE), as described by Hoge W S, Tan H, Kraft R A. Robust EPI Nyquist ghost elimination via spatial and temporal encoding. Magn Reson Med 2010; 64(6):1781-1791, which is incorporated herein by reference in its entirety for all purposes. EPI-GESTE combines PLACE and PAGE and was shown to improve ghost correction for non-accelerated single-shot EPI. The application of this method is limited, however, to low-acceleration EPI data because, in GESTE, the data is separated according to the readout gradient polarity that was used to acquired the data, either positive (RO+) or negative (RO−), and then GRAPPA is applied independently to each set of data. One consequence is that the effective acceleration rate for the GRAPPA reconstruction is double the acquired acceleration rate. Thus, the effective SNR limit for acceleration is met much earlier than other EPI reconstruction methods.

As described hereinafter, the present disclosure provides a system and method that allows ghost correction to be incorporated directly into the GRAPPA reconstruction operation. That is, rather than apply Nyquist ghost correction (NGC) and pMRI as two separate operations, the present disclosure enables the incorporation of the sampling grid shift correction as part of the pMRI data recovery. This can be achieved by introducing a "dual polarity" GRAPPA kernel that draws simultaneously from two separate portions of the data-one sampled on EPI positive readout data (RO+), and one sampled on EPI negative readout data (RO−)—to synthesize the target image data. This stands in contrast with traditional GRAPPA, where source data is derived from a single sampled set.

Figure 4A:
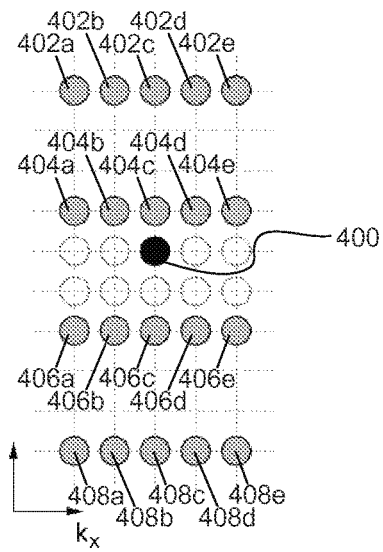
FIG. 4*a* is a graphic illustration of a k-space sampling technique according to a traditional parallel imaging strategy.
Figure 4B:
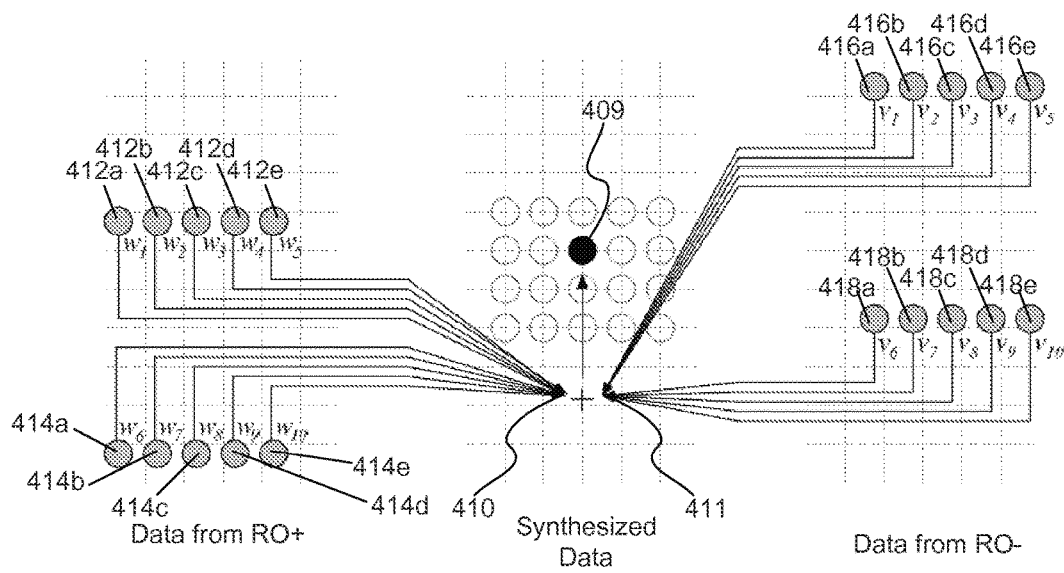
FIG. 4*b* is a graphic illustration of a k-space sampling technique in accordance with the present disclosure.

Specifically, this distinction is illustrated in FIGS. 4A and 4B. That is, FIG. 4A shows a traditional GRAPPA signal flow. In this illustration of traditional GRAPPA, when one is seeking to generate a missing k-space data point at a given location 400 for data from a single coil, information is synthesized from surrounding locations 402*a-e*, 404*a-e*, 406*a-e*, and 408*a-e* from all coils and displaced in both $k_x$ and $k_y$ directions in k-space. Thus, in traditional GRAPPA, ghost correction is performed after source data acquisition, to first align the data on 402*a-e* and 406*a-e* with data on 404*a-e* and 408*a-e*. Source data 400 is then derived from a single sampled set 402*a-e*, 404*a-e*, 406*a-e*, and 408*a-e*.

In particular, traditional two dimensional (2D) GRAPPA can be described as generating a desired data point in k-space (the target, k) from a weighted linear combination of source points as:

$$\hat{k}[x, y, c] = \sum_{i=0}^{N_x} \sum_{j=\{0,\ldots,N_y\}} \sum_{l=0}^{N_c} w_{\{i,j,l\}} k[x + (i - N_x/2), y + r(j - N_y/2), l];$$

where $w_{\{i,j,l\}}$ are the GRAPPA reconstruction weights, k[x, y, c] are the source data, r is the distance between sampled k-space lines at (x, y), and $N_x$, $N_y$ are the extent of the GRAPPA kernel along the $k_x$ and $k_y$ directions, respectively.

The GRAPPA weights, $w_{\{i,j,l\}}$, are determined from auto calibration signals (ACS) that are sampled at the Nyquist rate (e.g. fully sampled, non-accelerated), whereby one identifies the proper weights that map the source ACS data to the (known) target ACS data. Once determined, the weights are then employed to synthesize missing data in subsequent under sampled MRI acquisitions.

On the other hand, FIG. 4B illustrates the signal flow of an implementation of a dual polarity kernel approach in accordance with the present disclosure, which will be described hereafter as dual-polarity (DP) GRAPPA. Rather than apply Nyquist ghost correction (NGC) and pMRI as two separate operations, as described above, for a given target data 409, a sampling grid shift correction is incorporated as part of the pMRI data recovery, which results in samples from RO+ and RO− that, conceptually, can be thought of as forming RO+ data 410 and RO− data 411. That is, the present disclosure provides a dual polarity GRAPPA kernel that draws simultaneously from two separate portions of the data—one sampled on EPI positive readout data (412*a*-412*e* and 414*a*-414*e*) and one sampled on EPI negative readout data (416*a*-416*e* and 418*a*-418*e*)—to synthesize the target image data 409. This is in contrast with traditional GRAPPA, where source data is derived from a single sampled set. As will be explained below, to incorporate the sampling grid shift correction, weights W1-W10 may be drawn from EPI source data sampled when the readout gradient has a positive polarity (RO+) and weights V1-V10 may be drawn from the EPI data sampled when the readout gradient has a negative polarity (RO−).

That is, the present disclosure improves the reconstruction of EPI data by employing a dual polarity GRAPPA kernel, as illustrated in FIG. 4*b*, for a 5 $k_x$-by-4 $k_y$ kernel, where the weighted combination of source points is:

$$\hat{k}[x, y, c] = \sum_{i=0}^{N_x} \sum_{j=\{0,2,4,\ldots,N_y\}} \sum_{l=0}^{N_c} w_{[i,j,l]} k[x + (i - N_x/2), y + d(j - N_y/2), l] +$$

$$\sum_{i=0}^{N_x} \sum_{j=\{1,3,5,\ldots,N_y\}} \sum_{l=0}^{N_c} v_{[i,j,l]} k[x + (i - N_x/2), y + r(j - N_y/2), l].$$

Note that the data, k, referred to above is EPI data prior to ghost correction. To emphasize the ghost correction character of the dual-polarity kernel, the RO+ and RO− source points in FIG. 4b are both separate from the target sampling grid and offset to the left and right.

A benefit of this approach is that the many degrees of freedom provided by the GRAPPA coefficients captures ghost correction terms beyond the simple scalar and linear terms, which improves the overall image quality of the final image. That is, the use of the dual-polarity kernel is able to accurately capture and correct higher order phase errors. Phase errors in EPI are typically modeled as a linear shift between the RO+ and RO− sampling grids, with an additional constant phase correction term. Higher-order errors have been addressed in some efforts, but they are typically difficult to characterize and harder to accurately model.

The dual-polarity GRAPPA kernel provided herein is a k-space convolution operator. This kernel is able to efficiently model and correct both linear and higher order phase error terms, which will be described further hereafter. The DP-GRAPPA reconstruction weights use three calibration data sets: one corresponding to only RO+ data, one corresponding to only RO− data, and one corresponding to the hybrid target data. Specifically, as will be described in further detail, to generate the RO+, RO−, and hybrid ACS data sets, a set of temporally encoded pre-imaging acquisition calibration data is acquired. For each EPI segment of calibration data acquired, a second version of the same data is acquired using readout gradients of opposite polarity, as described above. The acquired data is then sorted such that a complete image can be formed from each of the RO+ and RO− samples. The hybrid target calibration data is then formed, as will be described. A linear system, Ax=b, is formed with elements of A drawn from RO+ and RO− ACS data and the elements of b drawn from hybrid, ghost-corrected or ghost-free ACS data or ACS data having reduced-inducing data compared to traditional ACS data. Solving the system generates the DP-GRAPPA reconstruction parameters in the vector, x.

Figure 5:
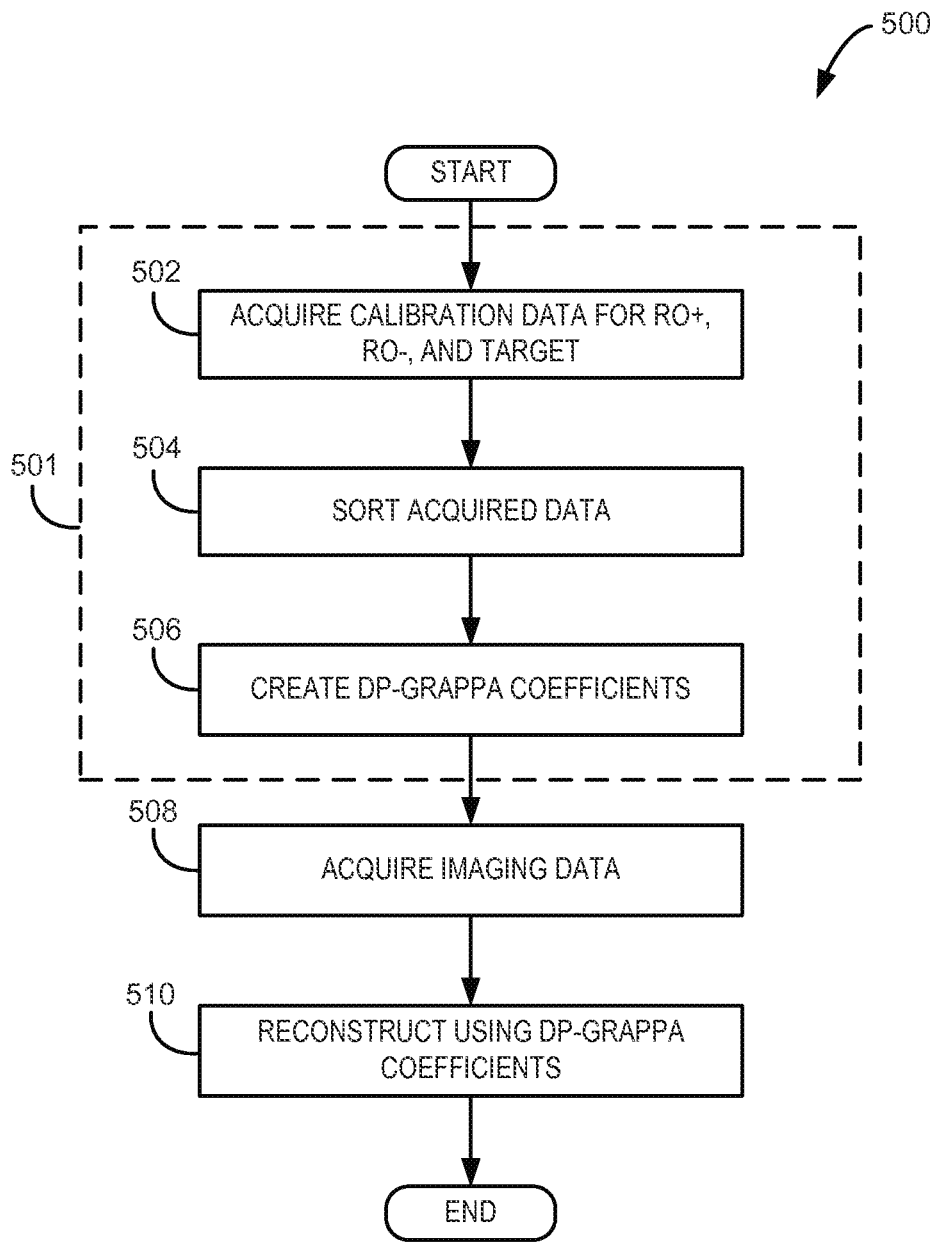
FIG. 5 is a flow chart providing steps of an example of a method in accordance with the present disclosure.
Figure 6:
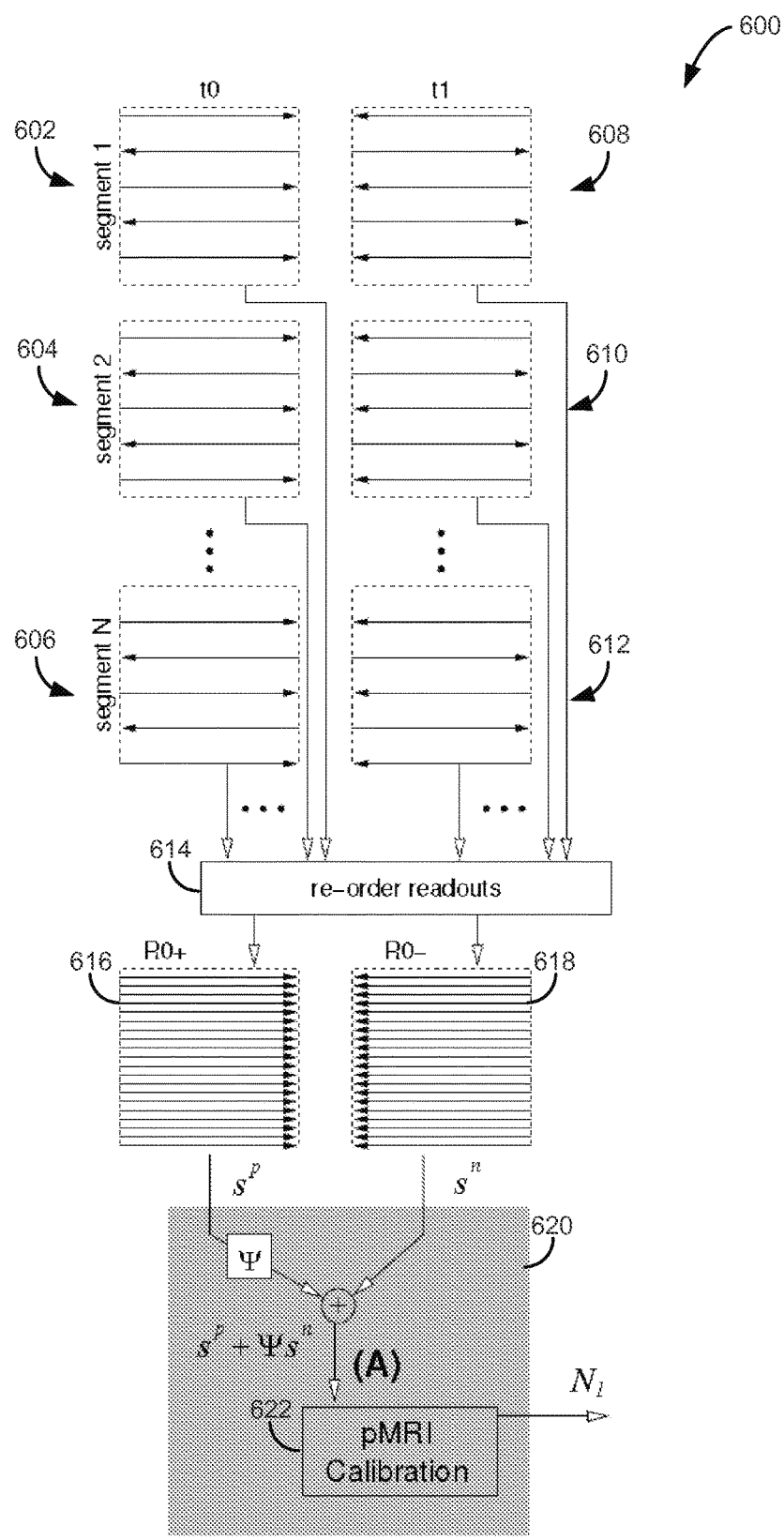
FIG. 6 is a schematic block, flow diagram of an example of steps for acquiring processing calibration data in accordance with the present disclosure.

Referring to FIGS. 5 and 6, the steps of an example of a process 500 to carryout the above-described DP-GRAPPA imaging process are illustrated in FIG. 5 and the steps of an example of a process for generating suitable calibration data 600 from temporally encoded segmented EPI data is illustrated in FIG. 6. To this end, a first portion 501 of the steps illustrated in FIG. 5 is directed to acquiring calibration images and will be described in conjunction with FIGS. 6 and 7.

To generate the RO+, RO−, and hybrid ACS data sets, a set of temporally encoded pMRI calibration data are first acquired at process block 502. That is, referring to FIG. 6, for each EPI segment 602, 604, 606 of pMRI calibration data acquired, a second segment is acquired using readout gradients of opposite polarity 608, 610, 612. The acquired data is then sorted at process block 504 such that a complete image can be formed from each of the RO+ and RO− samples. That is, as illustrated in FIG. 6, a re-ordering is performed 614 that yields RO+ data 616 and RO− data 618.

The image quality of parallel imaging reconstructions such as GRAPPA and SENSE depend on accurate calibration data. In typical calibration of GRAPPA kernels, the source and target data points are drawn from the same data set. Here, however, the calibration process acquires three data sets. Namely, as illustrated in FIG. 4b, these three data sets include RO+ data 410, RO− data 411, and target data 409. Because the calibration data is EPI based, image reconstruction quality will be improved if each individual set is ghost-corrected, ghost-free, or has reduced probability of inducing ghosts relative to traditional calibration data acquired by traditional techniques. Towards this end, GESTE is utilized at block 620 to generate target data 622 used in the GRAPPA kernel calibration.

Traditionally, GESTE has been focused on single-shot EPI data. However, as used herein, the method is extended to multi-shot EPI data. GESTE expects the acquisition of temporally encoded data pairs. To accommodate multi-shot data, the present disclosure reverses the readout gradient polarity for each segment (e.g., $G_x$-toggle), as described above, and acquires the multiple shots needed for each slice before proceeding to the next slice (as in the Fast Low-angle Excitation Echo-planar Technique, or 'FLEET', method). That is, the processing occurs in two passes. In a first (bootstrap) pass, the data from the temporally encoded multi-shot data may be first corrected, for example using a traditional phase correction method to shift each readout onto the same sampling grid. For the RO+ and RO− calibration data, the temporally encoded multi-shot data is reordered, as described above, correcting for phase differences between the shots as needed.

Figure 7:
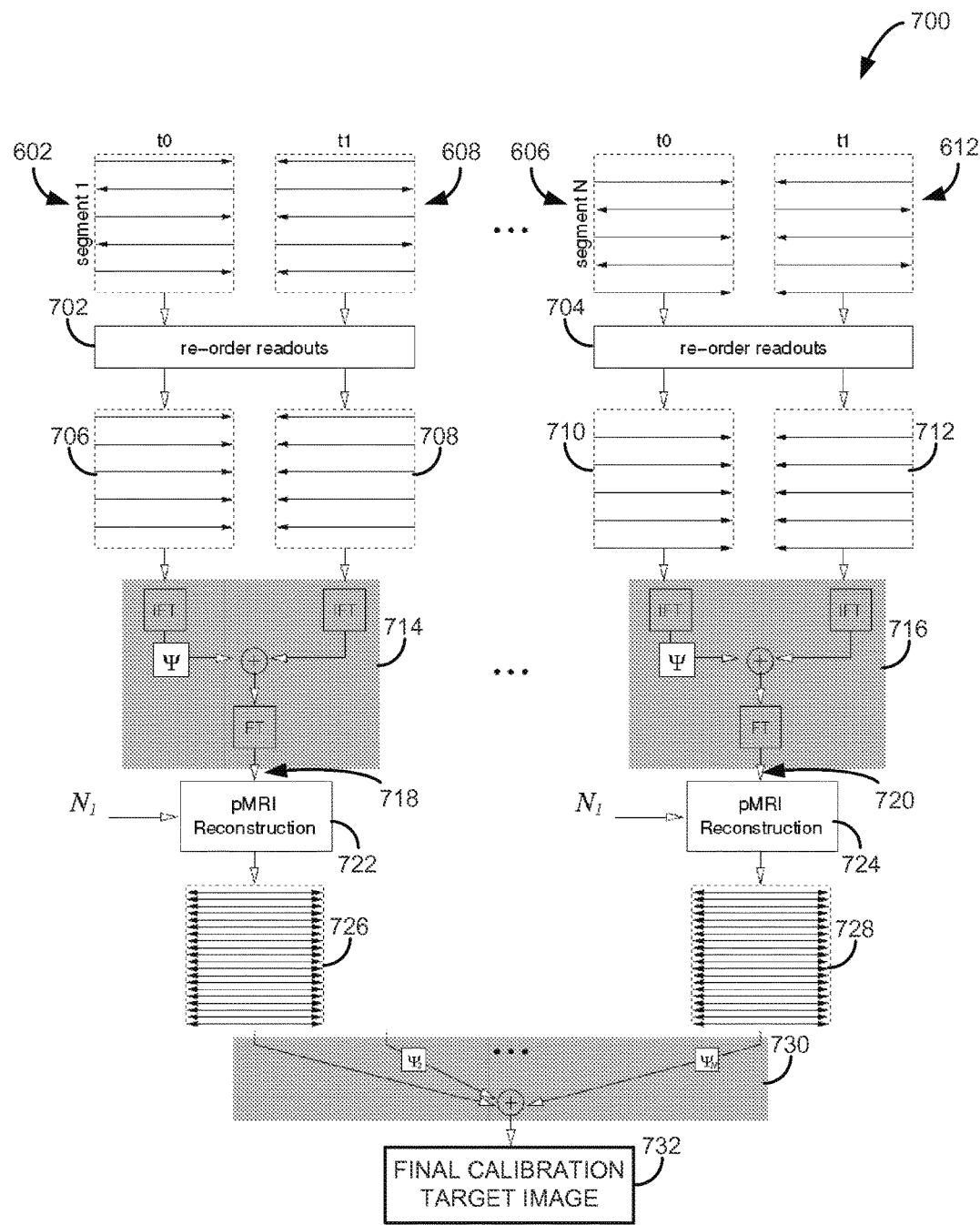
FIG. 7 is a further example of steps for acquiring processing calibration data in accordance with the present disclosure.

The data is then averaged across all data sets to form the boot-strap data to calibrate a set of GRAPPA coefficients, $N_l$. For example, the RO+ data 616 and RO− data 618 may be added coherently to generate the ghost-free calibration data or ghost-corrected 622 as described above. This may result in significant signal cancellation at this coherent summation stage, however. Thus, the steps described above with respect to FIG. 6 may constitute a first pass and be followed by a second pass or second stage, as illustrated in FIG. 7. That is, the set of GRAPPA coefficients generated at the end of the first pass 620 are then used a second stage of ACS processing 700. In the second stage 700, the original multi-shot data 602-612 is paired by segment 702, 704 to generate segment-specific RO+ data 706, 710 and RO− data 708, 712 and then a coherent summation may be performed to cancel phase errors that are present in each segment pair. These per-segment data 708-712 are used to perform GESTE 714, 716 on each pair of shots independently, using the GRAPPA weights $N_l$ from the boot-strap/first stage. Each GESTE-processed shot 718, 720 is then reconstructed 722, 724 to form a Nyquist-rate image 726, 728 for each shot. These images 726, 728 are then coherently combined 730 and the final calibration image 732. As such, at process block 506 of FIG. 5, the final DP-GRAPPA coefficients are determined.

Referring again to FIG. 5, at process block 508 imaging data is acquired. Notably, the present disclosure and DP-GRAPPA works with both non-accelerated and accelerated acquisitions. Thus, process block 508 may be performed with or without acceleration. Also notably, the present disclosure and DP-GRAPPA works with single-channel receivers. That is, the DP-GRAPPA method described herein works on single-channel data as well. This is unexpected because traditional GRAPPA requires multiple receiver channels, and DP GRAPPA is an extension of GRAPPA to EPI. However, the RO+ and RO− data effectively act as separate channels, and so naturally provide enough signal differentiation to allow ghost correction in single channel data using DP GRAPPA.

Figure 8:
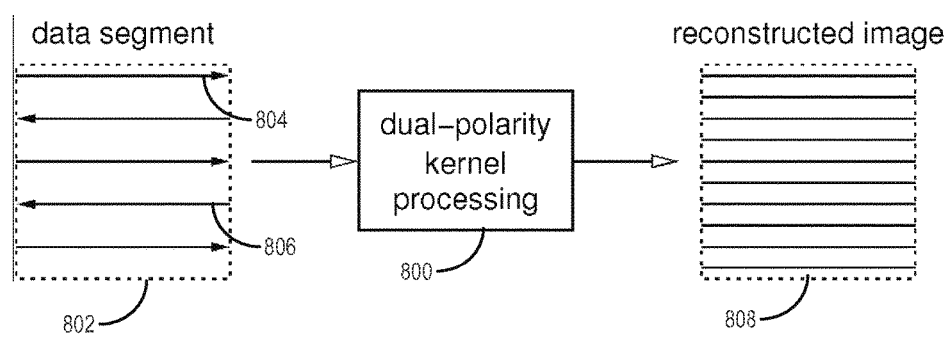
FIG. 8 is a schematic diagram illustrating example steps of a process for reconstructing an image in accordance with the present disclosure.

At process block 510, the DP-GRAPPA coefficients are applied to the raw/uncorrected image data to synthesize the final image data. As illustrated in FIG. 8, the dual-polarity kernel 800 is applied to the raw EPI data 802 comprised of both RO+ data 804 and RO− data 806 simultaneously to generate ghost corrected image data 808 that meets the Nyquist criterion, yielding an un-aliased image. Unlike traditional GRAPPA, none of the original sampled data is used in the final synthesized image. That is, each line of k-space is synthesized. This is not detrimental, however, for in the reconstruction of k-space lines corresponding to the sampled lines, the ghost correction aspect of the DP-GRAPPA parameters is dominant.

One notable difference between traditional GRAPPA and the above-described DP-GRAPPA systems and methods is that images reconstructed with traditional GRAPPA can incorporate the measured data into the final image. That is, traditional GRAPPA can use sampled data in the final image. In sequences other than EPI, this is considered to be advantageous because the SNR of the final image is improved. In EPI, however, the sampled data likely contains phase errors. While these errors are ostensibly corrected by traditional phase error correction methods, these corrections are often insufficient in the presence of higher order phase errors and will yield low quality pMRI reconstructions.

In contrast, the above-described DP-GRAPPA systems and methods do not employ explicit ghost correction at the reconstruction stage. Instead synthesized data that forms the final image exists at all sampled k-space locations. While it may at first appear to be counter-intuitive not to include the original sampled data in the final output, tests and simulations have demonstrated that the above-described DP-GRAPPA systems and methods produce much better ghost correction for the sampled lines than a traditional constant-and-linear phase correction can provide. That is, in traditional GRAPPA with standard ghost correction, two ghost correction operations need to be applied—one at calibration, and one at reconstruction. If either corrections are insufficient, the reconstruction will degrade. By contrast, DP-GRAPPA systems and methods employ only one ghost correction operation, and thus has a higher likely hood of success.

Another advantage of DP-GRAPPA systems and methods is that they remove many implementation ambiguities. Employing DP-GRAPPA removes the need to explicitly model the higher order phase error terms-which may be present or not.

DP-GRAPPA also removes the difficulty of estimating phase error correction terms from navigator signals that may exhibit very low SNR due to coil configuration and slice orientation. That is, in the above-described approach, Nyquist ghost correction (NGC) is not performed using navigators. Instead ghost correction is achieved by training the GRAPPA kernel to ghost-free target data during the calibration procedure. The ghost-free calibration data is generated through a process that employs reversed readout polarity data through the acquisition of the two temporal encodes then resorts and combines this data, and signal cancellation occurs where there are inconsistencies between the data that is interleaved. The GRAPPA calibration is higher quality than traditionally-created GRAPPA calibration because of the absence of errors due to sub-par Nyquist ghost correction.

Also, higher-order ghost correction terms—beyond the simple scalar and linear correction provided by most methods—are successfully modeled by the above-described dual-polarity kernel. The EPI phase errors that produce Nyquist ghosts are typically modeled as a linear shift between the RO+ and RO− sampling grids, with an additional constant phase correction term. The dual-polarity GRAPPA kernel described above is also able to efficiently model and correct high-order phase error terms. This results in a dramatic improvement in overall image quality compared to methods that apply ghost correction and pMRI reconstruction separately.

It is noted that, in practice, one could modify the standard approach to model higher-order phase errors as well. However, these models would need to be explicitly stated for each EPI acquisition scenario. In many cases, adding additional model terms in scenarios where they are not needed may lead to over-fitting of the model, which would reduce image quality. Also, the data employed in standard phase error correction methods are typically only 3-5 lines of navigator data prior to the EPI echo train. Performing a high order fit to such limited, and possibly noisy, data is prone to estimation error as well. For these reasons, the above-described DP GRAPPA systems and method provide substantial advantages by automatically providing a mechanism to capture and correct higher order phase error terms, without requiring an explicit phase error model.

It is well known that in the interface region between brain and air in the nasal sinuses and canals there is a significant deviation from the homogeneous B0 field. When thick EPI slices are acquired near these regions, signal loss due to phase incoherence induced by the local field inhomogeneity often results. It appears that the local field inhomogeneity in brain regions near the nasal sinuses also produces very complicated phase gradients in the EPI data. This manifests as signal ripples and similar artifacts through a number of slices when this data is reconstructed using GRAPPA with traditional state-of-the-art ghost correction methods. These steep phase gradients appear to cause higher-order phase errors in the navigator data, which are projections of the image data along the phase-encoded direction. In contrast, the DP-GRAPPA systems and methods of the present disclosure have been demonstrated to correctly compensate for these high-order phase errors, producing images of significantly higher quality.

A key benefit of the DP-GRAPPA reconstruction is its ability to remove other forms of phase errors that alternate between RO+ and RO− data and that are removed from the calibration data by GESTE processing. One additional form of phase error are alternating phase errors along the $k_y$ direction which can occur when asymmetry or cross-terms are present in eddy currents, or when differing gradient amplifier responses or group delays among gradient axes occur across physical gradient axes. These offsets in $k_y$ from the desired locations of the k-space samples are depicted in FIG. 4b as a 'bunching' of the sampling grid in the $k_y$ direction. These errors manifest in oblique slices and thus this ghosting artifact is known as an "oblique ghost". Because the GESTE processing can eliminate oblique ghosts as well, the DP GRAPPA reconstruction can also be employed in cases where oblique ghosts are present. Standard 1D navigator based NGC methods are unable to remove this form of ghosting caused by alternating phase errors along the $k_y$ direction.

While the DP-GRAPPA method can be applied for combined ghost correction and GRAPPA reconstruction of accelerated data, this technique can also be applied to unaccelerated data for ghost correction alone. This method can outperform conventional ghost correction methods in the presence of higher-order phase errors along the $k_x$ or $k_y$ directions.

For accelerated EPI acquisitions, the above-described process removes the dependence on ghost correction of the raw accelerated data. Current standard practice requires NGC for both calibration data and accelerated data. By removing this dependence, image quality can be improved because, for example, incorrect NGC at either stage can negatively affect the final images. The above-described approach exhibits a further benefit of greater robustness in the presence of motion during highly accelerated EPI-BOLD fMRI acquisitions.

Also, local field inhomogeneity can introduce higher order phase error terms, which will adversely effect EPI data acquired using high pMRI acceleration factors and/or at high field. With its ability to automatically estimate higher-order phase errors, without needing an explicit high-order model, the above-described DP-GRAPPA reconstruction methods are much more robust than standard phase-error correction and pMRI techniques currently provide.

The kernel-size is moderately significant and should desirably be large enough to capture the shift, but large integer shifts can be corrected first by rotating the k-space data through the coordinate space and, then, DP-GRAPPA can be run with kernel sizes comparable to traditional GRAPPA. Larger kernels can support more severe ghosting effects (e.g., higher order ghosting terms). A secondary effect is reduced noise in the signal void region.

The present invention has been described in terms of one or more preferred embodiments, and it should be appreciated that many equivalents, alternatives, variations, and modifications, aside from those expressly stated, are possible and within the scope of the invention. Features suitable for combinations and sub-combinations would be readily apparent to persons skilled in the art upon review of the present application as a whole. The subject matter described herein and in the recited claims intends to cover and embrace all suitable changes in technology.

As used in the claims, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The invention claimed is:

1. A magnetic resonance imaging (MRI) system, comprising:
a magnet system configured to generate a polarizing magnetic field about at least a portion of a subject arranged in the MRI system;
a magnetic gradient system including a plurality of magnetic gradient coils configured to apply at least one magnetic gradient field to the polarizing magnetic field;
a radio frequency (RF) system configured to apply an RF field to the subject and configured to receive magnetic resonance signals from the subject using a coil array;
a computer system programmed with non-transitory computer readable media that when executed by the computer system, causes the computer system to:
control the magnetic gradient system and the RF system according to a calibration pulse sequence in order to acquire positive readout gradient (RO+) data and negative readout gradient (RO−) data;
assemble the acquired RO+ data and the acquired RO− data to form a complete image data set for the RO+ data and the RO− data;
combine the acquired RO+ data and the acquired RO− data in order to generate calibration data having reduced ghost artifacts when compared to traditionally-acquired calibration data;
derive dual-polarity coefficients from the generated calibration data having reduced ghost artifacts;
control the magnetic gradient system and the RF system according to an imaging pulse sequence in order to acquire magnetic resonance (MR) image data; and
reconstruct the MR image data into an MR image of the subject using the dual-polarity coefficients which is then provided on a display or stored in a memory of the magnetic resonance imaging system.

2. The MRI system of claim 1 wherein, in order to combine the acquired RO+ data and the acquired RO− data, the computer system is further configured to perform a coherent summation of the acquired RO+ data and the acquired RO− data.

3. The MRI system of claim 1 wherein in order to generate the calibration data having reduced ghost artifacts, the computer system is further configured to perform a ghost elimination via spatial and temporal encoding (GESTE) process.

4. The MR system of claim 1 wherein the computer system is further configured to independently re-order the acquired RO+ data and the acquired RO− data in order to create an independently re-ordered RO+ data set and an independently re-ordered RO− data set.

5. The MRI system of claim 1 wherein the at least one of the calibration pulse sequence or the imaging pulse sequence is a multi-shot pulse sequence.

6. The MRI system of claim 1 wherein the computer system is configured to control a readout gradient polarity for each segment acquired using the multi-shot pulse sequence in order to reverse segments and in order to acquire multiple shots for each slice before proceeding to a subsequent slice.

7. The MRI system of claim 5 wherein the computer system is further configured to use the independently re-ordered RO+ data and the independently re-ordered RO− data along with the reconstruction coefficients in order to perform a GESTE process and reconstruct, therefrom, an MR image for each shot of the multi-shot pulse sequence.

8. The MRI system of claim 7 wherein the computer system is further configured to coherently combine each MR image and derive the reconstruction coefficients therefrom.

9. The MRI system of claim 1 wherein the calibration pulse sequence includes a multi-shot echo-planar imaging (EPI) pulse sequence.

10. The MRI system of claim 1 wherein the imaging pulse sequence includes a multi-shot echo-planar imaging (EPI) pulse sequence.

11. The MRI system of claim 1 wherein the computer system is configured to perform the reconstruction using a generalized autocalibrating partially parallel acquisitions (GRAPPA) reconstruction process.

12. A magnetic resonance imaging (MRI) system, comprising:
a magnet system configured to generate a polarizing magnetic field about at least a portion of a subject arranged in the MRI system;
a magnetic gradient system including a plurality of magnetic gradient coils configured to apply at least one magnetic gradient field to the polarizing magnetic field;
a radio frequency (RF) system configured to apply an RF field to the subject and configured to receive magnetic resonance signals from the subject using a coil array;

a computer system programmed with non-transitory computer readable media that when executed by the computer system, causes the computer system to:
control the magnetic gradient system and the RF system in order to perform a single or a multi-shot pulse sequence when acquiring calibration data;
process the acquired calibration data based on a polarity of a readout gradient applied with respect to RO+ data and RO− data;
perform a ghost elimination via spatial and temporal encoding (GESTE) process using the RO+ data and a RO− data in order to generate ghost-corrected calibration data;
process the ghost corrected calibration data based on a polarity of a readout gradient applied and a segment acquired in order to form a per-segment RO+ data and a per-segment RO− data;
using the ghost-corrected calibration data and the per-segment RO+ data and a per-segment RO− data, perform a per-shot GESTE process in order to generate a per-shot data set; and
generate final reconstruction parameters using the per-shot data set.

13. The MRI system of claim 12 where the computer system is further programmed to reconstruct the per-shot data set into a plurality of shot-specific MR images and coherently combine the shot-specific MR images into a final calibration MR image.

14. The MRI system of claim 12 wherein the computer system is further programmed to control the magnetic gradient system and the RF system in order to perform an MR imaging pulse sequence to acquire MR image data and reconstruct the acquired MR image data into an MR image of the subject using the final reconstruction parameters.

15. The MRI system of claim 14 wherein the computer system is configured to reconstruct the MRI image using a generalized autocalibrating partially parallel acquisitions (GRAPPA) reconstruction process.

16. The MRI system of claim 12 wherein the multi-shot pulse sequence includes a multi-shot echo-planar imaging (EPI) pulse sequence.

17. An MRI method for generating calibration data and for reconstructing magnetic resonance imaging (MRI) images of a subject acquired using a parallel imaging acquisition process, the method comprising:
performing a multi-shot magnetic resonance pulse sequence in order to acquire calibration data;
processing the acquired calibration data based on a polarity of a readout gradient applied with respect to RO+ data and RO− data;
performing a ghost elimination via the performing of a spatial and temporal encoding (GESTE) process using the RO+ data and a RO− data in order to generate ghost-corrected calibration data;
processing the acquired calibration data based on a polarity of a readout gradient applied and a segment of image data acquired using the pulse sequence ire order to form a per-segment RO+ data and a per-segment RO− data;
performing a per-shot GESTE process in order to generate a per-shot data set using the ghost-corrected calibration data along with the per-segment RO+ data and a per-segment RO− data; and
generating final calibration parameters using the per-shot data set which are then provided to a user displayed on a display or stored in a memory of a computer system.

18. The MRI method of claim 17 further comprising reconstructing the per-shot data set into a plurality of shot-specific MR images and coherently combining the shot-specific MR images into a final calibration image.

19. The MRI method of claim 17 further comprising combining the RO+ data and the RO− data using a coherent summation of the RO+ data and the RO− data.

* * * * *

UNITED STATES PATENT AND TRADEMARK OFFICE
CERTIFICATE OF CORRECTION

PATENT NO. : 10,495,717 B2
APPLICATION NO. : 15/505389
DATED : December 3, 2019
INVENTOR(S) : William S. Hoge et al.

Page 1 of 1

It is certified that error appears in the above-identified patent and that said Letters Patent is hereby corrected as shown below:

On the Title Page

In The Abstract (57):

Line 5, "the RQ- data" should be --the RO- data--.

Line 7, "the RQ™ data" should be --the RO- data--.

In the Specification

Column 1, Line 27, "but process about" should be --but precess about--.

Column 10, Line 19, "target, k)" should be --target, $\hat{k}$ )--.

In the Claims

Column 18, Claim 17, Line 20, "sequence ire order" should be --sequence in order--.

Signed and Sealed this
Fourth Day of February, 2020

Andrei Iancu
*Director of the United States Patent and Trademark Office*